(12) United States Patent
Roberts

(10) Patent No.: US 9,647,621 B2
(45) Date of Patent: May 9, 2017

(54) METHODS, SYSTEMS, AND MEDIA FOR CONTROLLING AUDIO OF AN HDMI AUDIO SYSTEM

(71) Applicant: Google Inc., Mountain View, CA (US)

(72) Inventor: Eric Jason Roberts, Chandler, AZ (US)

(73) Assignee: Google Inc., Mountain View, CA (US)

( * ) Notice: Subject to any disclaimer, the term of this patent is extended or adjusted under 35 U.S.C. 154(b) by 200 days.

(21) Appl. No.: 14/303,363

(22) Filed: Jun. 12, 2014

(65) Prior Publication Data

US 2014/0369526 A1 Dec. 18, 2014

Related U.S. Application Data

(60) Provisional application No. 61/834,518, filed on Jun. 13, 2013.

(51) Int. Cl.
*H03G 3/00* (2006.01)
*H03G 3/20* (2006.01)
(Continued)

(52) U.S. Cl.
CPC ........... *H03G 3/20* (2013.01); *H04N 21/4222* (2013.01); *H04N 21/43635* (2013.01); *H04N 21/4852* (2013.01)

(58) Field of Classification Search
CPC ................. H03G 3/20; H04N 21/4852; H04N 21/43635; H04N 21/4222
(Continued)

(56) References Cited

U.S. PATENT DOCUMENTS 7,379,778 B2  5/2008  Hayes et al.
7,720,238 B2  5/2010  Tomita
(Continued)

FOREIGN PATENT DOCUMENTS

EP     2485484     8/2012

OTHER PUBLICATIONS

HDMI Licensing, LLC et al., "High-Definition Multimedia Interface Specification Version 1.3a: Supplement 1 Consumer Electronics Control (CEC)", Nov. 10, 2006, pp. CECi-CEC97, available at: http://www.microprocessor.org/HDMISpecification13a.pdf.
(Continued)

*Primary Examiner* — Paul S Kim
(74) *Attorney, Agent, or Firm* — Byrne Poh LLP

(57) ABSTRACT

Mechanisms for controlling an audio level of an HDMI audio system are provided, the mechanisms comprising: causing audio data to be presented by an HDMI audio system at a current system volume level; receiving a requested volume level from a second screen device; and controlling a system volume level by: (a) determining the current system volume level; (b) determining a change in volume based on a difference between the requested volume level and the current system volume level; (c) determining a direction in which to cause the system volume level to change; (d) sending a volume control message to the system using a consumer electronic control bus connected to the system indicating whether to increase or decrease the system volume level based on the determined direction of system volume change; and (e) repeating (a)-(d) until the current system volume level reaches a predetermined value.

18 Claims, 7 Drawing Sheets

(51) Int. Cl.
*H04N 21/422* (2011.01)
*H04N 21/4363* (2011.01)
*H04N 21/485* (2011.01)

(58) Field of Classification Search
USPC ........................................................ 381/107
See application file for complete search history.

(56) References Cited

U.S. PATENT DOCUMENTS

| | | |
|---|---|---|
| 2009/0007596 A1 | 1/2009 | Goldstein et al. |
| 2010/0052843 A1 | 3/2010 | Cannistraro |
| 2011/0293113 A1 | 12/2011 | McCarthy |
| 2012/0180093 A1* | 7/2012 | Ishihara ................. H04N 5/607 725/80 |
| 2013/0107131 A1* | 5/2013 | Barnett .................. G08C 17/02 348/734 |

OTHER PUBLICATIONS

International Search Report & Written Opinion in International Patent Application No. PCT/US2014/042150, filed Jun. 12, 2014, mailed Oct. 15, 2014.

* cited by examiner

| Address | Device |
|---|---|
| 0 | TV |
| 1 | Recording Device 1 |
| 2 | Recording Device 2 |
| 3 | Tuner 1 |
| 4 | Playback Device 1 |
| 5 | Audio System |
| 6 | Tuner 2 |
| 7 | Tuner 3 |
| 8 | Playback Device 2 |
| 9 | Playback Device 3 |
| 10 | Tuner 4 |
| 11 | Playback Device 3 |
| 12 | Reserved |
| 13 | Reserved |
| 14 | Free Use |
| 15 | Unregistered (as initiator address) Broadcast (as destination address) |

300

RELATED ART

FIG. 3

METHODS, SYSTEMS, AND MEDIA FOR CONTROLLING AUDIO OF AN HDMI AUDIO SYSTEM

CROSS-REFERENCE TO RELATED APPLICATION

This application claims the benefit of U.S. Provisional Patent Application No. 61/834,518, filed Jun. 13, 2013, which is hereby incorporated by reference herein in its entirety.

TECHNICAL FIELD

The disclosed subject matter relates to methods, systems, and media for controlling audio of an HDMI audio system.

BACKGROUND

In general, as shown in FIG. 1, a High-Definition Multimedia Interface (HDMI) source 102 (e.g., a source of audio and/or video data such as a set-top box, a digital media receiver, an optical media player, etc.) can use a unidirectional interface to transmit audio and/or video data to an HDMI sink 104 so that the audio and/or video data can be presented. As also shown in FIG. 1, audio and/or video data can be transmitted over TMDS channels 106 from an HDMI transmitter 108 of HDMI source 102 to an HDMI receiver 110 of HDMI sink 104, and a signal or signals can be sent from HDMI sink 104 to HDMI source 102 over a hot plug detect (HPD) line 112 to indicate to HDMI source 102 that an HDMI connection has been established between HDMI source 102 and HDMI sink 104.

Certain HDMI sources can use a Consumer Electronic Control (CEC) line 114 to communicate with an HDMI sink and/or one or more other HDMI sources connected in a network via a CEC bus. Messages sent on the CEC bus using CEC line 114 can be addressed to a particular physical and/or logical address of an HDMI device connected to the CEC bus (e.g., as described below). Particular types of messages that comply with the HDMI CEC standard can be sent over the CEC bus to a particular address (e.g., a physical address and/or a logical address) or as a broadcast message to all HDMI devices connected to the CEC bus. For example, messages to control a system volume can be sent over the HDMI bus so that any HDMI device connected to the CEC bus can control the volume of the system. The volume controls specified by the HDMI standard include, for example, volume up, volume down, mute, and unmute.

However, the HDMI standard only allows for discrete volume control, such as volume up or volume down, and does not include an instruction for setting a system volume level to a specific level (e.g., as a percentage of the maximum volume).

Accordingly, it is desirable to provide methods, systems and media for controlling audio of an HDMI audio system.

SUMMARY

In accordance with various implementations of the disclosed subject matter, methods, systems, and media for controlling audio of an HDMI audio system are provided.

In accordance with some implementations of the disclosed subject matter, methods for controlling audio of an HDMI audio system are provided, the methods comprising: causing audio data to be presented by an HDMI audio system at a current system volume level of the HDMI audio system; receiving a requested volume level from a second screen device; and controlling a system volume level of the HDMI audio system by: (a) determining the current system volume level of the HDMI audio system; (b) determining a change in volume based on a difference between the requested volume level and the current system volume level; (c) determining a direction in which to cause the system volume level to change; (d) sending a volume control message to the HDMI audio system using a consumer electronic control bus connected to the HDMI audio system, wherein the volume control message indicates whether to increase or decrease the system volume level based on the determined direction in which to cause the system volume to change; and (e) repeating (a)-(d) until the current system volume level reaches a predetermined value.

In accordance with some implementations of the disclosed subject matter, systems for controlling audio of an HDMI audio system are provided, the systems comprising: a hardware processor that is programmed to: cause audio data to be presented by an HDMI audio system at a current system volume level of the HDMI audio system; receive a requested volume level from a second screen device; and control a system volume level of the HDMI audio system by: (a) determining the current system volume level of the HDMI audio system; (b) determining a change in volume based on a difference between the requested volume level and the current system volume level; (c) determining a direction in which to cause the system volume level to change; (d) sending a volume control message to the HDMI audio system using a consumer electronic control bus connected to the HDMI audio system, wherein the volume control message indicates whether to increase or decrease the system volume level based on the determined direction in which to cause the system volume to change; and (e) repeating (a)-(d) until the current system volume level reaches a predetermined value.

In accordance with some implementations of the disclosed subject matter, non-transitory computer-readable media containing computer executable instructions that, when executed by a processor, cause the processor to perform methods for controlling audio of an HDMI audio system are provided, the methods comprising: causing audio data to be presented by an HDMI audio system at a current system volume level of the HDMI audio system; receiving a requested volume level from a second screen device; and controlling a system volume level of the HDMI audio system by: (a) determining the current system volume level of the HDMI audio system; (b) determining a change in volume based on a difference between the requested volume level and the current system volume level; (c) determining a direction in which to cause the system volume level to change; (d) sending a volume control message to the HDMI audio system using a consumer electronic control bus connected to the HDMI audio system, wherein the volume control message indicates whether to increase or decrease the system volume level based on the determined direction in which to cause the system volume to change; and (e) repeating (a)-(d) until the current system volume level reaches a predetermined value.

In accordance with some implementations of the disclosed subject matter, systems for controlling audio of an HDMI audio system are provided, the systems comprising: means for causing audio data to be presented by an HDMI audio system at a current system volume level of the HDMI audio system; means for receiving a requested volume level from a second screen device; and means for controlling a system volume level of the HDMI audio system by: (a)

determining the current system volume level of the HDMI audio system; (b) determining a change in volume based on a difference between the requested volume level and the current system volume level; (c) determining a direction in which to cause the system volume level to change; (d) sending a volume control message to the HDMI audio system using a consumer electronic control bus connected to the HDMI audio system, wherein the volume control message indicates whether to increase or decrease the system volume level based on the determined direction in which to cause the system volume to change; and (e) repeating (a)-(d) until the current system volume level reaches a predetermined value.

In some implementations, the predetermined value is the requested volume level.

In some implementations, the predetermined value is a volume control threshold that is a predetermined amount greater than or less than an initially determined current system volume.

In some implementations, the predetermined value is a value at which the current system volume is determined to have crossed from one side of the requested volume level to the other side of the requested volume level.

In some implementations, the requested volume is received as a percentage of a maximum volume of the audio system.

In some implementations, the requested volume is received as a percentage change in the volume from the current volume level.

In some implementations, the systems further comprise means for establishing a connection with a second screen device through which the requested volume is received from the second screen device.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

FIG. 3 shows an example of logical addresses that can be assigned to various HDMI devices in accordance with some implementations of the disclosed subject matter.

DETAILED DESCRIPTION

In accordance with various implementations, mechanisms (which can include methods, systems, and media) for controlling audio of an HDMI audio system are provided.

In some implementations, mechanisms are provided for controlling a volume level of an HDMI audio system using a second screen device, wherein the volume level can be controlled using a user interface element other than volume buttons (e.g., a volume up button, and a volume down button). For example, a volume slider can be provided using a second screen device, and a current position of the slider can be used to set a volume level of an HDMI system.

In some implementations, a volume level of an HDMI audio system can be controlled using a second screen device by selecting a particular volume level, or a particular change in volume level using a user interface of the second screen device. In some implementations, a current system volume of the HDMI audio system can be determined by sending a request for the current system volume on the CEC bus.

In some implementations, a requested volume level can be determined based on an input received by a user interface of the second screen device, and a change in volume level to be executed can be determined based on the difference between the requested system volume and the current system volume. Additionally, this can include a direction of volume change (e.g., volume up or volume down) and an amount by which to change the volume.

In some implementations, based on the difference between the requested volume and the current system volume, the mechanisms described herein can send an instruction to change the volume in an appropriate direction (e.g., up or down) on the CEC bus, and can determine the system volume again after controlling the volume level of the system.

In some implementations, the mechanisms described herein can determine whether the current system volume is at an appropriate level based on determining that a predetermined condition has been met, such as determining that the current volume is equal to the requested volume, determining that a threshold amount of change in the volume level has occurred since a request to change the system volume was received, or any other suitable condition.

In some implementations, if the condition has been met, the mechanisms described herein can determine that the system volume is at an appropriate level, can cease changing the volume, and can wait to receive a new command to change the volume level.

Figure 1:
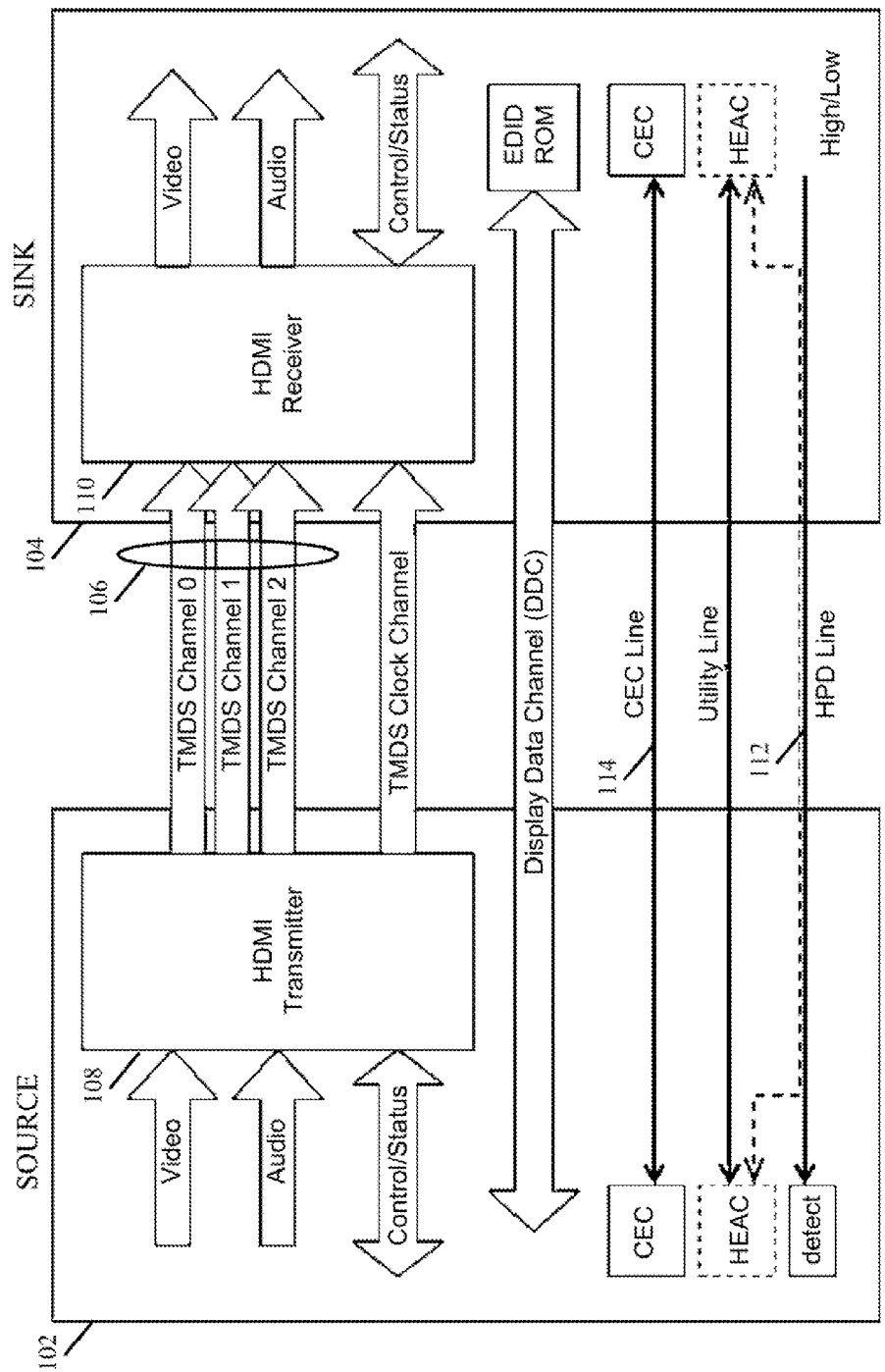
FIG. 1 shows an example of interconnections between an HDMI source and an HDMI sink in accordance with related art.
Figure 2:
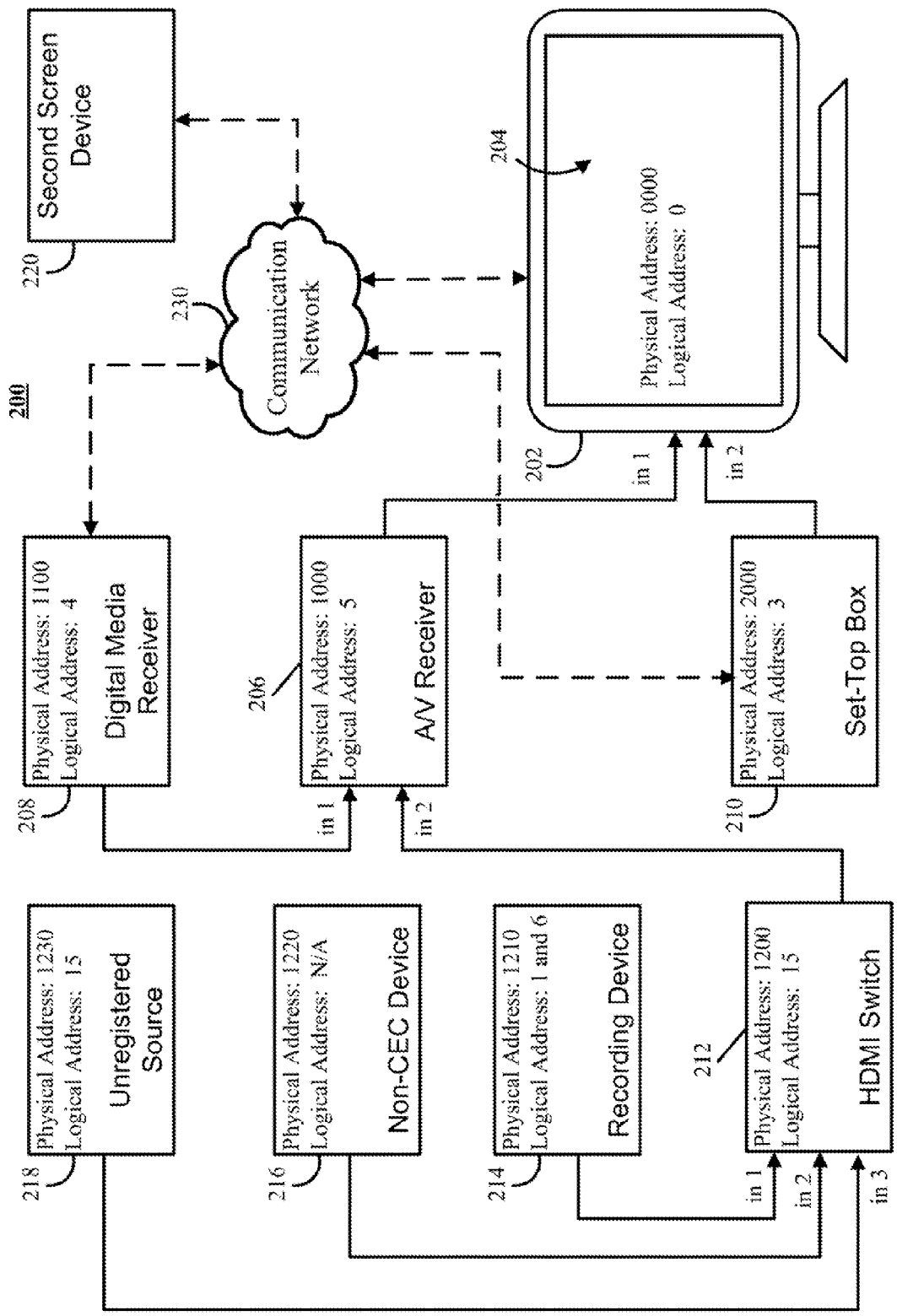
FIG. 2 shows an example of a system for controlling a volume level of an HDMI audio system using a second screen device in accordance with some implementations of the disclosed subject matter.

Turning to FIG. 2, an example 200 of a system for controlling a volume level of an HDMI audio system using a second screen device is shown in accordance with some implementations of the disclosed subject matter. In some implementations, system 200 can include multiple HDMI devices 206-218 connected to a root device 202 using HDMI communication links. These multiple HDMI devices can be interconnected by a Consumer Electronic Control (CEC) bus that allows two-way communication of messages between connected CEC-enabled HDMI devices. As shown in FIG. 2, audio and/or video data can be sent over the HDMI connections (solid lines in FIG. 2 interconnecting devices 202 and 206-218) uni-directionally, and CEC messages can be sent bi-directionally over the same connections. In some implementations, root device 202 can include any suitable display 204 for presenting video data from one or more of devices 206-218, and/or an amplifier and speaker(s) for presenting audio data from one or more of device 206-218.

In some implementations, each HDMI device included in system 200 and connected to the CEC bus can be assigned a physical address and/or a logical address. In some implementations, the physical address can be defined by a path from the root device 202 to any particular HDMI device of the system. Additionally, the physical address can be defined hierarchically, such that the physical address of a particular HDMI device identifies all interconnections between root device 202 and that particular HDMI device. For example, root device 202 can take physical address 0.0.0.0, which can define the device as the root device of the HDMI network. As another example, a first HDMI device connected to a first HDMI connector of root device 202 (e.g., HDMI device 206) can take physical address 1.0.0.0, indicating that such device is connected directly to the first HDMI connector of root device 202. Similarly, a second HDMI device connected to a second HDMI connector of root device 202 can take physical address 2.0.0.0, indicating that such device is connected directly to the second HDMI connector of root device 202. As yet another example, a third HDMI device (e.g., HDMI device 208) connected to root device 202 via an intermediate HDMI device (e.g., HDMI device 206), can take a physical address 1.1.0.0, which can indicate that the device is connected to root device 202 through HDMI device 206.

In some implementations, an HDMI device included in system 200 can be assigned a logical address in addition to a physical address. Such logical address can sometimes act as a unique identifier for the HDMI device (depending on the logical address, as described below), and can identify functions that the HDMI device can perform. Additionally, multiple logical addresses can correspond to a single HDMI device in system 200, if such a device is configured to perform multiple functions and/or receive instructions to perform multiple functions. FIG. 3 shows an example 300 of logical addresses that can be assigned to various HDMI devices based on the function(s) of the HDMI device. In some implementations, a logical address can be assigned when an HDMI device is connected to system 200, when the HDMI device transitions from a "standby" state to an "on" state, etc.

In some implementations, each HDMI device that is in an "on" state and connected to root device 202 can be assigned a unique logical address (or addresses) if possible. As described above, a logical address assigned to an HDMI device can be based on functions that the device can carry out. For example, root device 202 can be a digital television, and can take logical address 0 indicating that digital television 202 is a television, having an output 204 which can include, e.g., a display, amplifiers, speakers, a projector, etc. As another example, HDMI device 206 can be an audio-video receiver (AVR), and can take logical address 5 indicating that AVR 206 is an audio system. As yet another example, HDMI device 208 can be a digital media receiver (e.g., a computing device for presenting audio and/or video information from various sources, such as: a remote content server; a network attached storage; a second computing device connected over a local or non-local data network), and can take logical address 4 indicating that digital media receiver 208 is a playback device (note that digital media receiver 208 is sometimes referred to herein as DMR 208 or receiver 208). As still another example, HDMI device 210 can be a set-top box, and can take logical address 3 indicating that set-top box 210 has a tuner.

In some implementations, system 200 can include various HDMI devices, such as an HDMI switch 212, which can have physical address 1.2.0.0 (e.g., indicating that HDMI switch 212 is connected to the second input of a device connected to the first input of television 202, having physical address 0.0.0.0), and logical address 15 (e.g., indicating that HDMI switch 212 is acting as a switch without other functions, and thus is an unregistered device). Note that, in some implementations, each logical address may only be assigned to a single physical address, except that logical address 15 can be assigned to multiple physical addresses. In some implementations, system 200 can further include: a recording device 214, which may have a tuner and a recording capability, and therefore can take logical addresses 1 and 6 if recording device 214 exposes both functions of the device to system 200, and which can have physical address 1.2.1.0 (e.g., indicating a position of recording device 214 within the network of system 200); a non-CEC enabled HDMI device 216, such as a game console that does not comply with the CEC standard can have physical address 1.2.2.0, but may not be assigned a logical address because the device does not comply with the CEC standard; and an unidentified HDMI source 218, which can have physical address 1.2.1.0 and logical address 15 (e.g., indicating that HDMI source 218 is unregistered as a particular type of HDMI device).

In some implementations, various messages can be sent over the CEC bus to control actions of CEC enabled devices connected to system 202. For example, a tuner of a first device connected to the CEC bus can be controlled based on a message or messages received at the first device from a second device connected to the CEC bus. As another example, a tuner of a first device connected to the CEC bus can be controlled based on a message or messages received at the first device from a second device connected to the CEC bus. As yet another example, a power state (e.g., whether the device is in an "on" or "standby" state) of a first device connected to the CEC bus can be controlled based on a message or messages received at the first device from a second device connected to the CEC bus. As still another example, a first device connected to the CEC bus can declare itself as the active device on the CEC bus and can cause the root device (and/or other devices) to present content (e.g., audio and/or video content) supplied by the first device. As a further example, a first device connected to the CEC bus can send a message indicating a particular device on the bus to be set as the active source, which may or may not be a CEC enabled device (e.g., a message can be sent indicating that a non-CEC enable device has been set as the source).

In some implementations, any suitable message(s) that comply with the CEC standard can be sent and/or received over the CEC bus. For example, messages that correspond to remote control commands can be sent and/or received over the CEC bus. Such messages can include a particular remote control command, such as play, pause, mute, volume up, volume down, channel up, channel down, menu, etc.

In some implementations, a remote control command can be included in a <User Control Pressed> CEC message, which can include an operand corresponding to a particular remote control command to be passed to another device. In some implementations, such a <User Control Pressed> message can be sent to a particular physical address and/or logical address (e.g., a physical address and/or logical address of an active device). Additionally, when a remote control command has ended (or at any other appropriate time, such as prior to the device that sent the original message going into a standby mode), a <User Control Released> message can be sent to a device to which a <User Control Pressed> message was sent. When the device receives a <User Control Released> message, it can respond accordingly. For example, if a <User Control Pressed> message was received indicating that a volume up command was issued by a remote control of a device (or based on a button press at the device) that is the source of audio (or from a root device, such as a digital television), a receiving device can respond by increasing a volume level until a <User Control Released> message is received (or a predetermined time has passed). In a more particular example, if set-top box 210 is outputting audio and video data as the active device of system 200, in which audio data is being presented by A/V receiver 206 (e.g., through an alternative connection between digital television 202 and A/V receiver 206, such as an optical audio link, RCA audio connection, coaxial connection, etc.) while video data is being presented by digital television 202, a remote control command or commands received at set-top box 210 can be sent to digital television 202 and/or A/V receiver 206. In such an example, a volume up command received by set-top box 210 can be sent to A/V receiver 206 using a <User Control Pressed> message on the CEC bus. After sending such a message, set-top box 210 can cause a <Give Audio Status> message (described below) to be sent to A/V receiver 206, and can receive a <Report Audio Status> message (described below) from A/V receiver 206 indicating a current volume level. Such information can be used to cause a current volume level to be displayed to a user (e.g., as a volume bar) by set-top box 210 or digital television 202 (e.g., set-top box 210 can pass on the volume level received from the A/V receiver, the <Report Audio Status> message can be received at digital television 202, etc.).

In some implementations, a system audio control feature can be initiated to allow an audio amplifier connected to a root device (e.g., using any suitable connection, such as an optical audio connection, RCA audio connection, etc.) to present audio for a source of video being presented by the root device (e.g., audio from an active source can be presented using speakers connected to the amplifier). For example, a <System Audio Mode Request> message can be sent to the amplifier device on the CEC bus, and the amplifier can begin presenting such audio using any suitable input channel (e.g., an HDMI input channel, a fiber optic input channel, etc.). In a more particular example, referring to FIG. 2, if the system audio control feature is utilized, audio data being output by receiver 208 can be presented by A/V receiver 206, while video data being output by receiver 208 can be presented by digital television 202. In some implementations, during use of such a system audio control feature an audio output from the root device can be inhibited (e.g., muted), such that audio is only presented by the amplifier. In such implementations, audio control commands (e.g., volume up, volume down, mute, etc.) can be sent over the CEC bus to the amplifier. In some implementations, such audio control commands can be included in a <User Control Pressed> message based on a command received from a remote control of the device that is the source of the audio, received from a remote control of the root device, received locally at a device that is the source of the audio or the root device (e.g., such as receiving a button press at such a device), etc.

In some implementations, a volume level of audio output of a device (e.g., digital television 202, A/V receiver 206, etc.) can be requested by sending a <Give Audio Status> message on the CEC bus (e.g., to the physical address and/or logical address of the device presenting the audio). In response to receiving a <Give Audio Status> message, a device can reply with a <Report Audio Status> message on the CEC bus that specifies a current audio status of the device (e.g., a level between zero and 127, whether the audio is muted, etc.).

In some implementations, a second screen device 220 can be used to control presentation of audio and/or video by a device, such as an HDMI device in system 200. For example, second screen device 220 can connect to a device using a network, such as communication network 230 (described in more detail in connection with FIG. 6), and can be used to control content to be displayed on the connected device, control playback of such content by the device, control a volume at which the content is to be presented, etc.

In some implementations, an application running on the second screen device can cause a connection to be established between the second screen device and a device running a corresponding application for receiving commands from the second screen device. For example, second screen device 220 can run an application for controlling set-top box 210. In such an example, upon the application for controlling set-top box 210 starting (e.g., launching, being initiated by a user, etc.), it can cause a connection to be established between second screen device 220 and set-top box 210 (e.g., represented in FIG. 2 by dashed lines) using communication network 230. Commands can then be sent from second screen device 220 over such a connection to control operation of set-top box 210. For example, a command can be sent by second screen device 220 to tune to a particular channel, or to change a volume level. As described above, if a command is received to change a volume level, such a command can be passed on to a device presenting audio data outputted by set-top box 210 (e.g., digital television 202 or A/V receiver 206) as a <User Command Pressed> message on the CEC bus, including an operand corresponding to the action to be performed (e.g., volume up).

In some implementations, second screen device 220 can be used to control any suitable device, such as set-top box 210 (e.g., as described above), receiver 208, digital television 202, etc. Each device that can be controlled can run an application for establishing a connection with second screen device 220 and/or receiving commands from second screen device 220. Such commands can be received using any suitable technique(s). For example, second screen device 220 can have an infrared transmitter for transmitting codes that correspond to codes used by a remote control of the device (e.g., second screen device 220 can act as a universal remote control). As another example, second screen device 220 can transmit messages including commands to be carried out by the device (e.g., receiver 208) using any suitable encoding. Such commands can be encoded by an application running on second screen device 220 and decoded and/or interpreted by a corresponding application running on the device to be controlled.

In some implementations, a user interface of second screen device 220 can include a user interface element for changing a playback volume of audio being presented by a first screen device (e.g., digital television 202, receiver 208, set-top box 210, etc.). Such a volume control can include traditional volume controls, such as discrete buttons for issuing commands for volume up and/or volume down, or non-traditional volume controls, such as a slider for receiving any suitable volume level as an input from a user, a spinner for receiving volume control inputs through a gesture, a text entry user interface element for receiving any suitable volume level (e.g., as a value from 0-100%), etc.

Figure 4:
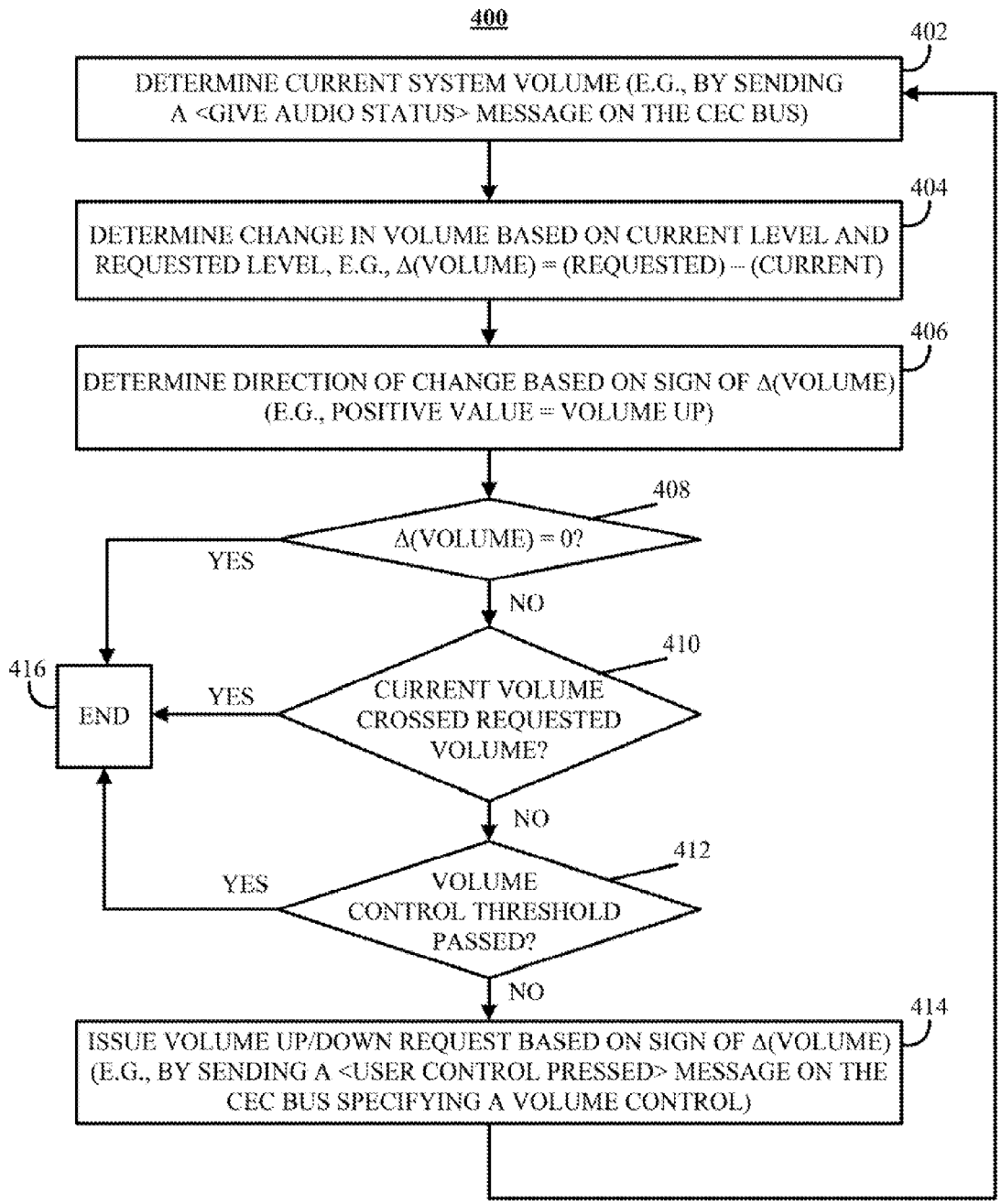
FIG. 4 shows an example of a process for controlling a volume level of an HDMI audio system using a second screen device in accordance with some implementations of the disclosed subject matter.

Turning to FIG. 4, an example 400 of a process for controlling a volume level of an HDMI audio device is shown in accordance with some implementations of the disclosed subject matter. Such a process can be used to control a volume level of an HDMI audio system to change the volume to a level specified by a second screen device. For example, process 400 can be used to determine a requested volume level (e.g., based on the position of a volume control slider), and control a volume level of an HDMI audio system that is presenting content (e.g., system 200) such that a current volume level is brought to the requested volume level. In a more particular example, a device executing process 400 (e.g., receiver 208) can receive a requested volume level from a second screen device (e.g., second screen device 220), and can execute process 400 in order to set the volume level of the HDMI audio system (e.g., digital television 202 and/or A/V receiver 206 in system 200) based on the requested volume level using CEC messages. In some implementations, receiver 208 may only respond to volume level requests from a connected second screen device in cases where receiver 208 is the active device in system 200 (e.g., when audio and/or video output by receiver 208 is being presented by a device in system 200 such as digital television 202 and/or A/V receiver 206) and/or in cases where receiver 208 is outputting audio and/or video data.

In some implementations, process 400 can start in response to receiving a requested volume level from a second screen device. The requested volume level can be received as a particular level (e.g., requested volume level is: twenty percent of maximum volume; a particular value of volume level; etc.), or as a requested change in level (e.g., requested volume level is: ten percent reduction/increase in volume based on current volume level; ten percentage point reduction/increase in volume based on maximum volume; a reduction/increase of fifteen steps in volume level; etc.).

At 402, after receiving a requested volume level, process 400 can determine a current system volume of a device that is currently being used to provide an audio output. For example, receiver 208 can receive a requested volume level from second screen device 220, and in response request a current volume level of system 200 by sending a <Give Audio Status> message on the CEC bus. In some implementations, such a message can be addressed to a particular device that is currently presenting audio (e.g., A/V receiver 206, digital television 202, etc.), can be broadcast to all devices on the CEC bus, can be sent to the root device (e.g., digital television 202) by rule, which can in turn determine a current volume of system 200, or any other suitable technique(s) for determining a current volume level of the HDMI audio system, etc. In some implementations, a current system volume can be determined based on a cached value of the current system volume. For example, after a volume level has been changed (e.g., after process 400 has been completed), the current system volume can be saved, to be used in another volume change operation.

In some implementations, the device executing process 400 can receive an audio status of the HDMI audio system as a response to the message requesting the current audio status. For example, receiver 208 can receive a <Report Audio Status> message on the CEC bus that includes a current audio level of a device outputting audio (e.g., digital television 202 and/or A/V receiver 206) in system 200. In some implementations, a <Report Audio Status> message can include a current volume level and/or a current mute status of the audio output. Additionally, in some implementations, the current volume level can be conveyed using any suitable technique(s). For example, the current volume level can be conveyed as a binary value from zero to 127 (e.g., from 0000000 and 1111111), or any other suitable technique(s) for conveying the audio level.

At 404, process 400 can determine a change in volume (e.g., Δ(Volume)) to be executed by process 400 based on the determined current volume level and the received requested volume level. Any suitable technique(s) can be used to determine the change in volume level. For example, a difference between the current volume level and the requested volume level can be found to determine the change in volume to be executed by process 400. In some implementations, the requested volume level and/or the current volume level can be converted, if necessary, to make the current volume level and the requested volume level directly comparable. For example, if the requested volume level is received as a percentage of a maximum volume and the current volume level is given as a binary number between 0 and 127, the requested volume level can be converted to a binary number between 0 and 127 based on the requested percentage of maximum. Alternatively, if the requested volume level is given as a percentage change or percentage point change in volume, the change in volume determined at 402 can be based on the requested change and the current volume level. In a more particular example, if the current volume level is reported as 64 (e.g., 1000000 as a binary number), and the requested change in volume is a reduction of ten percent, the change in volume determined at 404 can be a change of 6 steps (e.g., 6.4 is ten percent of 64, rounded down to 6). In such an example, the requested volume can be determined to be 58, and the change can be determined to be negative six.

At 406, process 400 can determine a direction of change of volume based on the current volume level and the requested volume level. For example, process 400 can determine whether the requested volume equates to an increase from the current volume level or a decrease from the current volume level (or no change). As another example, if a requested change in volume from the second screen device is a percent reduction or increase in volume, the sign of the change can be determined (e.g., a request to reduce the volume corresponds to volume down, and vice versa). In a more particular example, the direction of change (e.g., volume up or volume down) can be based on a sign of the difference between the requested volume and the current volume (e.g., a sign of Δ(Volume)). In such an example, a negative sign can equate to a request to decrease the volume and a positive sign can equate to a request to increase the volume.

At 408, process 400 can determine if the requested change in volume is equal to zero. For example, process 400 can determine whether the requested volume is equal to the current volume of the HDMI system as reported in a <Report Audio Status> message received on the CEC bus. In some implementations, if the difference is equal to zero it can indicate that no further changes to the system volume are required. If process 400 determines that the change in volume (e.g., Δ(Volume)) is equal to zero ("YES" at 408), process 400 can proceed to 416 where process 400 can end. Otherwise, if process 400 determines that the change in volume (e.g., Δ(Volume)) is not equal to zero ("NO" at 408), process 400 can proceed to 410.

At 410, process 400 can determine whether the current volume level has crossed the requested volume level, based on an initially determined volume and/or an initially determined direction for changing the volume. In some implementations, the current volume level can be considered to have crossed the requested volume level if the volume is set to increase (e.g., the requested volume level was higher than the initially determined volume level) and the current volume level is larger than the requested volume level, and vice versa. For example, if the requested volume is sixty and the initial current volume is forty, the current volume level has crossed the requested volume if the current volume is greater than sixty. As another example, if the direction of the change determined at 406 is negative (e.g., the requested volume level equates to a decrease in volume as compared to an initial current volume level), and the current volume level is less than the requested volume, the current volume level has crossed the requested volume level. If process 400 determines that the current volume has crossed the requested volume ("YES" at 410), process 400 can proceed to 416 where process 400 can end. Otherwise, if process 400 determines that the current volume level has not crossed the requested volume ("NO" at 410), process 400 can proceed to 412.

In some implementations, if the difference between the requested volume level and the current volume level is greater than a predetermined difference (e.g., greater than one, greater than two, etc.), process 400 can skip 410 based on the current volume level having overshot the requested volume level. In such implementations, the volume level can be changed back toward the requested volume level (e.g., the direction of change can be switched).

At 412, process 400 can determine whether a volume control threshold has been exceeded. In some implementations, the volume control threshold can be any suitable value. For example, the volume control threshold can be used to inhibit the volume from being changed more than a predetermined amount (e.g., ten steps, ten percentage points of the maximum volume, five steps, five percentage points of the maximum volume, five percent of the current volume, etc.) during any given execution of process 400. Such a volume control threshold can be based on the current volume, and can be different based on whether the requested change is to increase the volume or to decrease the volume (e.g., the allowed amount of volume decrease may be greater than the allowed amount of volume increase). In a more particular example, the volume control threshold can be a value such as ten, which can be used to inhibit the volume from being changed more than ten steps. In another more particular example, the volume control threshold can be ten steps in the positive direction (e.g., volume up) but not limited in the negative direction (e.g., volume down). That is, any volume level below the current volume level can be specified in such an example, but the volume can only be increased by a maximum of the predetermined number of steps. If process 400 determines that the volume control threshold has been exceeded ("YES" at 412), process 400 can proceed to 416 where process 400 can end. Otherwise, if process 400 determines the volume control threshold has not been exceeded ("NO" at 412), process 400 can proceed to 414.

At 414, process 400 can cause a volume change request to be sent on the CEC bus based on the direction of change determined at 406. For example, a device running process 400 can send a <User Control Pressed> message on the CEC bus with volume up as an operand in cases where the direction of change is positive or vice versa. In a more particular example, receiver 208 can send a <User Control Pressed> message on the CEC bus with volume up as an operand in response to receiving a request to increase the playback volume of audio being presented from receiver 208. In some implementations, after a predetermined time, the device executing process 400 can send a <User Control Released> message on the CEC bus, which can indicate that a change in volume carried out in response to the <User Control Pressed> message is to be ceased. In some implementations, process 400 can loop back to 402 and determine a current system volume after the volume has been changed. Process 400 can continue to execute 402-414 until one of the conditions at 408-412 is met and process 400 is ended at 416.

Figure 5A:
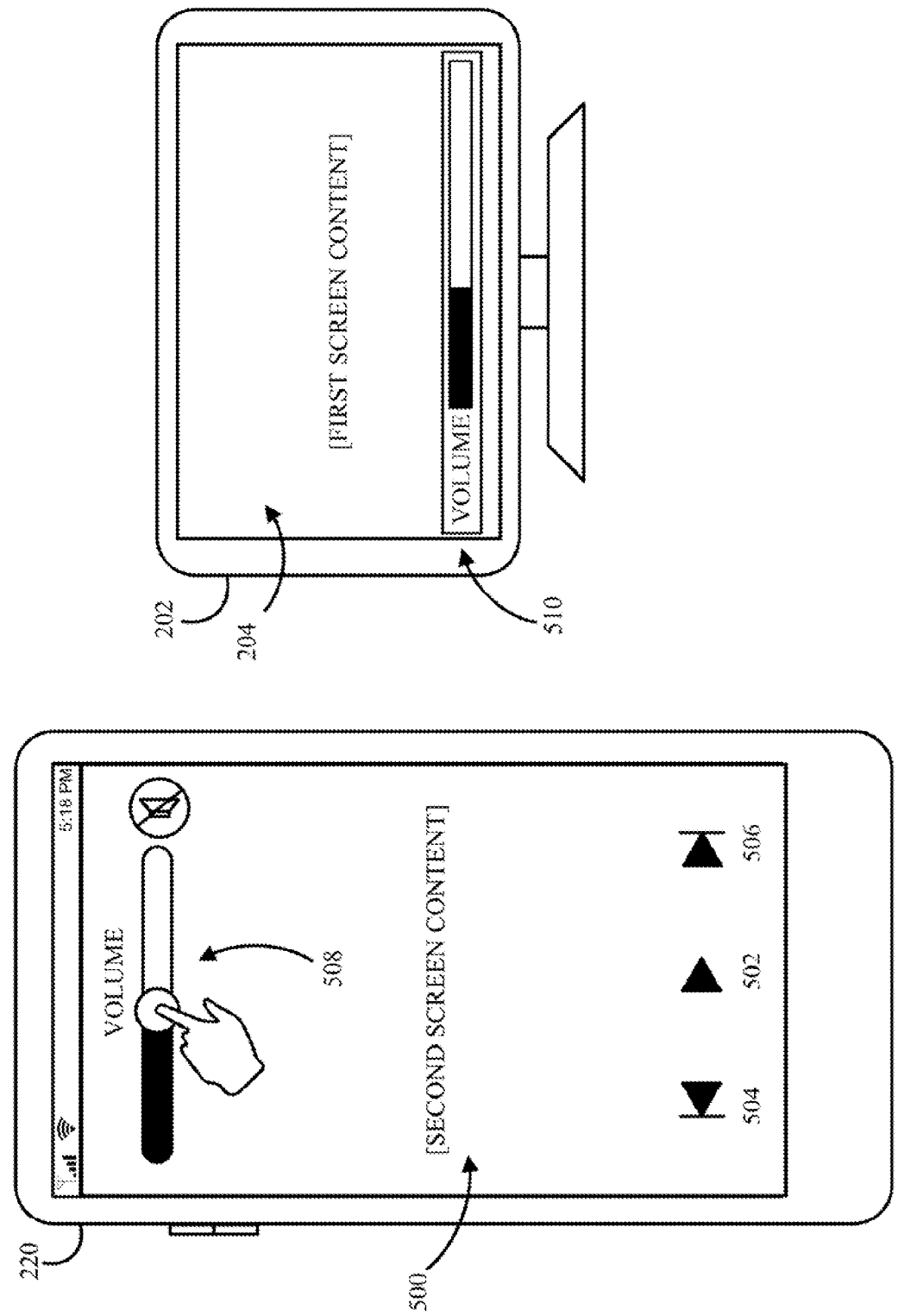
FIG. 5A shows an example of a second screen device presenting a volume slider in accordance with some implementations of the disclosed subject matter.

FIG. 5A shows an example of a second screen device presenting a volume slider that can be used with the mechanisms described herein for controlling a volume level of an HDMI audio system using a second screen device in accordance with some implementations of the disclosed subject matter. In the example of FIG. 5A, second screen device 220 can present a user interface including various controls 502-506 for controlling playback of media content (e.g., audio and/or video data) on digital television 202 using a display 500, which can be a touchscreen display. The user interface can further include a volume slider 508 that can indicate a current volume level being output by an amplifier used to present audio of the media content being presented (e.g., an amplifier included in digital television 202, an amplifier included in A/V receiver 206 which is not shown in FIG. 5A, etc.). In some implementations, volume slider 508 can also set a requested volume level based on a position of volume slider 508 along a bar corresponding to the volume of the HDMI audio system. In some implementations, a requested volume level can be sent from second screen device 220 to an HDMI device to be controlled (e.g., receiver 208). For example, if a user moves slider 508 along the bar that indicates volume, an application running on second screen device 220 can cause an instruction to be sent to receiver 208 to change the volume of the HDMI audio system (e.g., volume output by A/V receiver 206, digital television 202, etc.) to a requested volume level based on the new position of slider 508. In such an example, receiver 208 can receive the requested volume level from second screen device 220 and execute process 400 to cause the HDMI system volume to be adjusted to coincide with the requested volume level.

In some implementations, a position of slider 508 can be restricted based on a current position, such that a requested volume cannot be set that would cause a change in volume greater than a threshold (e.g., the volume control threshold described above in connection with FIG. 4). Additionally or alternatively, a rate of change of the location of slider 508 can be reactive based on a direction of change and/or a difference between a current position of slider 508 and an initial position of slider 508. For example, as a user moves slider 508 (e.g., by touching touchscreen 500 at a position corresponding to slider 508) in a direction that corresponds to increased volume, the speed at which slider 508 moves can decrease as slider 508 moves farther from the initial position of slider 508.

In some implementations, a current volume (e.g., as determined at 402) can be presented using a volume bar 510 displayed on display 204 of digital television 202. Such a current volume bar can be updated each time the current volume is determined at 402, and can be presented by digital television 202 as an overlay on content being presented by the HDMI device being controlled by second screen device 220 (e.g., digital television 202 can use a volume level in a <Report Audio Status> message to determine the current volume) or by the HDMI device being controlled by second screen device 220 as part of video data sent to digital television 202 (e.g., receiver 208 can use a volume level in a <Report Audio Status> message to determine the current volume, and include a volume bar 510 in video data sent using the HDMI connection between receiver 208 and digital television 202).

Figure 5B:
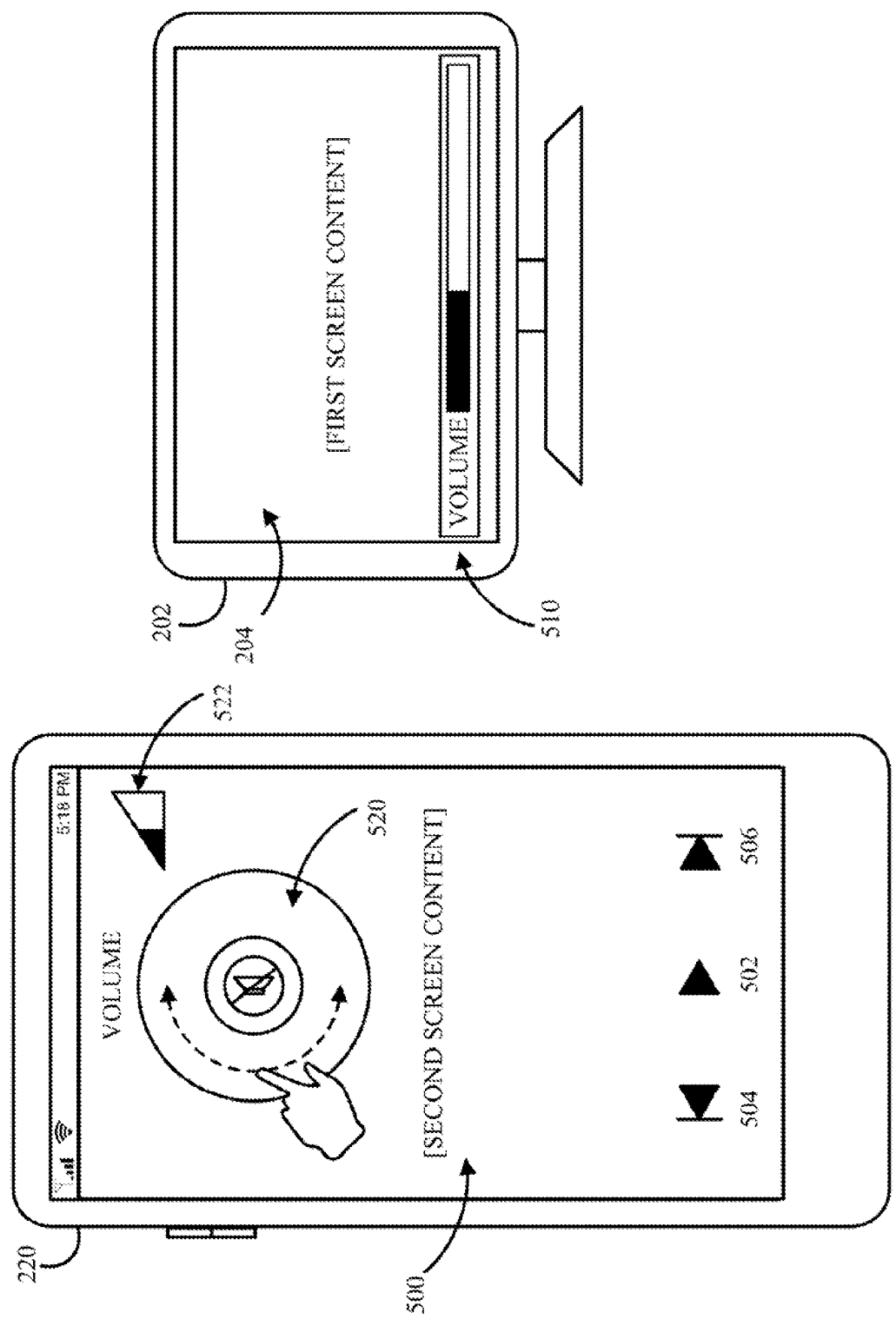
FIG. 5B shows an example of a second screen device presenting a volume spinner in accordance with some implementations of the disclosed subject matter.

FIG. 5B shows an example of a second screen device with a volume spinner that can be used with the mechanisms described herein for controlling a volume level of an HDMI audio system using a second screen device in accordance with some implementations of the disclosed subject matter. In the example of FIG. 5B, second screen device 220 can present a user interface including various controls 502-506 for controlling playback of media content (e.g., audio and/or video data) on digital television 202 using a display 500, which can be a touchscreen display. The user interface can further include a volume spinner 520 that can receive an input of a requested volume change based on a gesture(s) received at volume spinner 520. In some implementations, a requested volume level can be sent from second screen device 220 to an HDMI device to be controlled (e.g., receiver 208). For example, if an input is received at touchscreen 500 corresponding to volume spinner 520 and the input proceeds to correspond to a gesture over volume spinner 520 in a clockwise motion, an application running on second screen device 220 can cause an instruction to be sent to receiver 208 to increase the volume of the HDMI audio system (e.g., volume output by A/V receiver 206, digital television 202, etc.) a predetermined amount based on the speed of the user's gesture and/or the amount of revolutions of volume spinner 520 completed by the user. In such an example, receiver 208 can receive the requested volume change from second screen device 220 and execute process 400 to cause the HDMI audio system volume to be adjusted to coincide with the requested volume change. In some implementations, a current volume level of the HDMI audio system can be presented to the user by the second screen device as a volume indicator 522, or the like.

Figure 6:
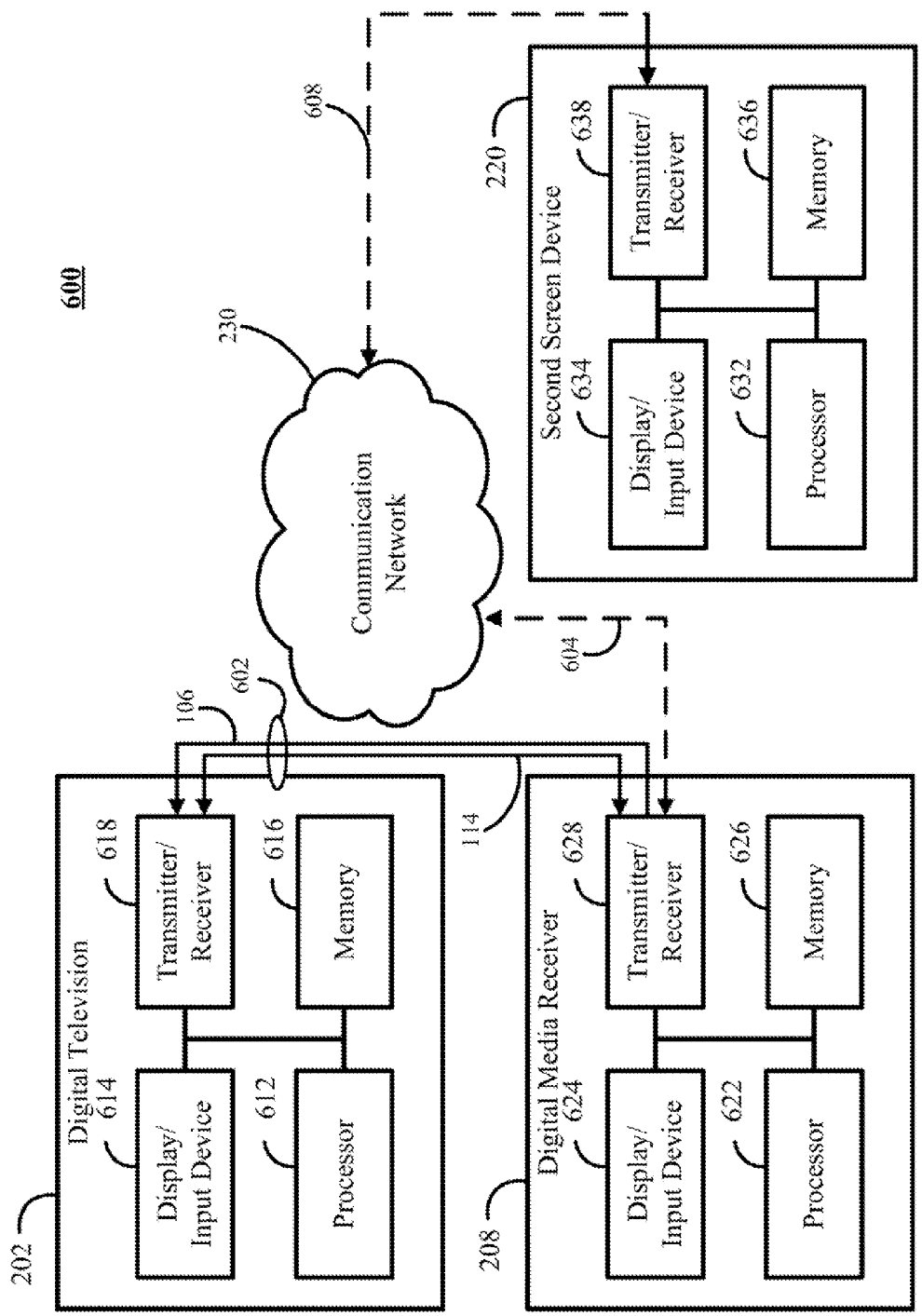
FIG. 6 shows an example of a schematic diagram of hardware in accordance with some implementations of the disclosed subject matter.

FIG. 6 shows an example 600 of a schematic diagram of hardware that can be used to implement digital television 202, digital media receiver 208, and second screen device 220 depicted in FIG. 2, in accordance with some implementations of the disclosed subject matter. As illustrated, system 600 can include digital television 202, digital media receiver 208, and second screen device 220. Note that digital media receiver 208 is merely shown as an example of a device that can be utilized with the mechanisms described herein, and it is understood that any other suitable device can be connected to the CEC bus and can use the mechanisms described herein for controlling audio of an HDMI system.

Digital media receiver 208 can be connected by an HDMI connection 602 to digital television 202. Note that the two lines 106 and 114 are shown between digital media receiver 208 and digital television 202 as part of HDMI connection 602, where line 106 (e.g., the TMDS channels) is unidirectional indicating that audio and/or video flows only from digital media receiver 208 to digital television 202, while line 114 (e.g., the CEC line) is bi-directional indicating that ancillary signals (e.g., the CEC messages on the CEC line/bus) can flow in both directions. HDMI connection 602 can be any suitable HDMI connection, which can include HDMI switches, or any other suitable hardware and/or software for causing audio and/or video output by digital media receiver 208 to be sent to digital television 202.

In some implementations, digital media receiver 208 can be connected by a communication link 604 to a communications network 230 that can be linked via a communications link 608 to second screen device 220.

In some implementations, digital television 202, digital media receiver 208, and second screen device 220 can be any of a general purpose device such as a computer or a special purpose device such as a client, a server, a television, etc. Any of these general or special purpose devices can include any suitable components such as a hardware processor (which can be a microprocessor, digital signal processor, a controller, etc.), memory, communication interfaces, display controllers, input devices, etc. For example, digital media receiver 208 can be implemented as a computer for receiving media content from a remote source and outputting such media content to a presentation device such as a television, a smartphone, a tablet computer, a wearable computer, a personal computer, a laptop computer, a gaming console, a set-top box, a smart television, a server, etc. As another example, second screen device 220 can be implemented as a smartphone, a tablet computer, a wearable computer, a personal computer, a laptop computer, etc.

Communications network 230 can be any suitable computer network or combination of such networks including the Internet, an intranet, a wide-area network (WAN), a local-area network (LAN), a wireless network, a digital subscriber line (DSL) network, a frame relay network, an asynchronous transfer mode (ATM) network, a virtual private network (VPN), etc. Communications links 604 and 608 can be any communications links suitable for communicating data among digital media receiver 208 and second screen device 220 such as network links, dial-up links, wireless links, hard-wired links, any other suitable communications links, or any suitable combination of such links.

In some implementations, digital television 202 can include a hardware processor 612, a display/input device 614, memory 616, and a transmitter/receiver 618, which can be interconnected. In some implementations, memory 616 can include a storage device (such as a non-transitory computer-readable medium) for storing a computer program for controlling hardware processor 612.

Hardware processor 612 can use the computer program to present on display/input device 614 audio and/or video data received from digital media receiver 208 and/or an interface that allows a user to, among other things, cause media content to be presented on display/input device 614 from digital media receiver 208 or any other suitable device, including from an internal tuner of digital television 202. It should also be noted that data received through HDMI connection 602 or any other communications links can be received from any suitable source. In some implementations, hardware processor 612 can send and receive data through HDMI connection 602 or any other communication links using, for example, a transmitter, receiver, transmitter/receiver, transceiver, or any other suitable communication device, such as transmitter/receiver 618. Display/input device 614 can include a touchscreen, a flat panel display, a cathode ray tube display, a projector, a speaker or speakers, and/or any other suitable display and/or presentation devices, and can further include a remote control, a computer keyboard, a computer mouse, a microphone, a touchpad, a voice recognition circuit, a touch interface of a touchscreen, and/or any other suitable input device. Transmitter/receiver 618 can include any suitable transmitter and/or receiver for transmitting and/or receiving, among other things, media content including audio and/or video content, which can include HDMI inputs (e.g., for receiving audio and/or video, receiving and/or sending CEC messages, etc.), an internal tuner, other analog or digital audio and/or video inputs/outputs (e.g., coaxial cable inputs and/or outputs, RCA inputs and/or outputs, component video inputs/outputs, any other suitable analog and/or digital outputs, or any suitable combination thereof), data inputs and/or outputs (e.g., Ethernet, Wi-Fi, cellular data, etc.), or any suitable combination thereof.

Digital media receiver 208 can include a hardware processor 622, a display/input device 624, memory 626, and a transmitter/receiver 628, which can be interconnected. In some implementations, memory 626 can include a storage device (such as a non-transitory computer-readable medium) for storing a computer program for controlling hardware processor 622.

Hardware processor 622 can use the computer program to provide audio and/or video data (e.g., receiver from remote content source 610) to transmitter/receiver 628 to be sent to digital television 202 over HDMI connection 602. It should also be noted that data received through communications link 604 or any other communications links can be received from any suitable source. In some implementations, hardware processor 622 can send and receive data through HDMI connection 602, communications link 604 or any other communication links using, for example, a transmitter, receiver, transmitter/receiver, transceiver, or any other suitable communication device, such as transmitter/receiver 628. Display/input device 624 can include a remote control, a computer keyboard, a computer mouse, a microphone, a touchpad, a voice recognition circuit, a touch interface of a touchscreen, and/or any other suitable input device, and can further include a touchscreen, a flat panel display, a cathode ray tube display, a projector, a speaker or speakers, and/or any other suitable display and/or presentation devices. Transmitter/receiver 628 can include any suitable transmitter and/or receiver for transmitting and/or receiving, among other things, media content including audio and/or video content, which can include HDMI inputs and/or outputs (e.g., for sending and/or receiving audio and/or video, sending and/or receiving CEC messages, etc.), an internal tuner, any other analog or digital audio and/or video inputs/outputs (e.g., coaxial cable inputs and/or outputs, RCA inputs and/or outputs, component video inputs/outputs, any other suitable analog and/or digital outputs, or any suitable combination thereof), data inputs and/or outputs (e.g., Ethernet, Wi-Fi, cellular data, etc., for receiving audio, video, or any other data over, for example, communication link 604), or any suitable combination thereof.

Second screen device 220 can include a hardware processor 632, a display/input device 634, memory 636, and a transmitter/receiver 628, which can be interconnected. In some implementations, memory 636 can include a storage device for storing data received through communications link 608 or through other links. The storage device (such as a non-transitory computer-readable medium) can further include a computer program for controlling hardware processor 632.

Hardware processor 632 can use the computer program to communicate with digital media receiver 208, as well as provide media content to receiver 208 and/or cause media content to be presented by receiver 208, among other things. In some implementations, hardware processor 632 can send and receive data through communications link 608 or any other communications links using, for example, a transmitter, receiver, transmitter/receiver, transceiver, or any other suitable communication device, such as transmitter/receiver 638. In some implementations, hardware processor 632 can receive commands and/or values transmitted by one or more devices, such as digital media receiver 208, and can present a user interface corresponding to such commands and/or values. Display/input device 634 can include a touchscreen, a flat panel display, a cathode ray tube display, a projector, a speaker or speakers, and/or any other suitable display and/or presentation devices, and can further include a computer keyboard, a computer mouse, a microphone, a touchpad, a voice recognition circuit, a touch interface of a touchscreen, and/or any other suitable input device. In some implementations, display/input device 634 can be include display 500 of FIGS. 5A-B, and can be used to present a user interface for receiving inputs from a user. Such inputs can be used to transmit commands to digital media receiver 208 (or any other suitable device) for controlling presentation of media content by such device. Transmitter/receiver 618 can include any suitable transmitter and/or receiver for transmitting and/or receiving, among other things, commands and/or values used for controlling an audio level of an HDMI system using inputs received on a display/input device 634.

It is understood that, although system 600 is described as including digital media receiver 208, digital television 202, and second screen device 220, such system can include any suitable devices which can utilize the mechanisms described herein for controlling a volume level of an HDMI audio system. For example, any suitable device described in connection with FIG. 2 can be used in conjunction with a second screen device (e.g., second screen device 220), to control a volume level of an HDMI audio system. As another example, any suitable device can utilize the mechanisms described herein to control a volume level of an HDMI audio system using an input corresponding to a non-traditional volume input (e.g., a volume slider rather than discrete volume up and/or down buttons).

In some implementations, any suitable computer readable media can be used for storing instructions for performing the functions and/or processes described herein. For example, in some implementations, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

It should be understood that the above described steps of the processes of FIG. 4 can be executed or performed in any order or sequence not limited to the order and sequence shown and described in the figures. Also, some of the above steps of the processes of FIG. 4 can be executed or performed substantially simultaneously where appropriate or in parallel to reduce latency and processing times.

It should also be noted that, as used herein, the term mechanism can encompass hardware, software, firmware, or any suitable combination thereof.

Accordingly, methods, systems, and media for controlling a volume level of an HDMI audio system using a second screen device are provided.

Although the invention has been described and illustrated in the foregoing illustrative implementations, it is understood that the present disclosure has been made only by way of example, and that numerous changes in the details of implementation of the invention can be made without departing from the spirit and scope of the invention, which is limited only by the claims that follow. Features of the disclosed implementations can be combined and rearranged in various ways.

What is claimed is:

1. A method for controlling audio of an HDMI audio system, the method comprising:
   causing, using a hardware processor of a first device, audio data to be presented by an HDMI audio system at a current system volume level of the HDMI audio system;
   receiving, at the hardware processor of the first device, a requested volume level from a second screen device over a wireless local area network, wherein the requested volume level comprises a value that represents the requested volume level; and
   in response to receiving the requested volume level, controlling, using the hardware processor of the first device, a system volume level of the HDMI audio system by:
      (a) determining the current system volume level of the HDMI audio system;
      (b) determining a requested change in volume based on a difference between the requested volume level and the current system volume level;
      (c) determining a direction in which to cause the system volume level to change based on the requested change in volume;
      (d) sending a volume control message to the HDMI audio system using a consumer electronic control bus connected to the HDMI audio system, wherein the volume control message indicates whether to increase or decrease the system volume level based on the determined direction in which to cause the system volume to change;
      subsequent to (d), determining an updated current system volume level of the HDMI audio system;
      (f) determining an updated requested change in volume based on a difference between the requested volume level and the updated current system volume level;
      (g) determining an updated direction in which to cause the system volume level to change based on the updated requested change in volume; and
      (h) in response to determining the updated direction, sending an updated volume control message to the HDMI audio system using the consumer electronic control bus, wherein the updated volume control message indicates whether to increase or decrease the system volume level based on the determined updated direction in which to cause the system volume to change.

2. The method of claim 1, further comprising determining that the updated requested change in volume is greater than a volume control threshold that is a predetermined amount greater than or less than an initially determined current system volume.

3. The method of claim 2, wherein the volume control threshold is a value at which the updated current system volume is determined to have crossed from one side of the requested volume level to the other side of the requested volume level.

4. The method of claim 1, wherein the value that represents the requested volume level is a percentage of a maximum volume of the audio system.

5. The method of claim 1, wherein the value that represents the requested volume level is a percentage change in the volume from the current volume level.

6. The method of claim 1, further comprising establishing the wireless local area network connection with the second screen device through which the requested volume level is received from the second screen device.

7. A system for controlling audio of an HDMI audio system, the system comprising:
   a hardware processor of a first device that is programmed to:
      cause audio data to be presented by an HDMI audio system at a current system volume level of the HDMI audio system;
      receive a requested volume level from a second screen device over a wireless local area network, wherein the requested volume level comprises a value that represents the requested volume level; and
      in response to receiving the requested volume level, control a system volume level of the HDMI audio system by:
         (a) determining the current system volume level of the HDMI audio system;
         (b) determining a requested change in volume based on a difference between the requested volume level and the current system volume level;
         (c) determining a direction in which to cause the system volume level to change based on the requested change in volume;
         (d) sending a volume control message to the HDMI audio system using a consumer electronic control bus connected to the HDMI audio system, wherein the volume control message indicates whether to increase or decrease the system volume level based on the determined direction in which to cause the system volume to change;
         (e) subsequent to (d), determining an updated current system volume level of the HDMI audio system;
         (e) determining an updated requested change in volume based on a difference between the requested volume level and the updated current system volume level;
         (f) determining an updated direction in which to cause the system volume level to change based on the updated requested change in volume; and
         (g) in response to determining the updated direction, sending an updated volume control message to the HDMI audio system using the consumer electronic control bus, wherein the updated volume control message indicates whether to increase or decrease the system volume level based on the determined updated direction in which to cause the system volume to change.

8. The system of claim 7, wherein the hardware processor is further programmed to determine that the updated requested change in volume is greater than a volume control threshold that is a predetermined amount greater than or less than an initially determined current system volume.

9. The system of claim 8, wherein the volume control threshold is a value at which the updated current system volume is determined to have crossed from one side of the requested volume level to the other side of the requested volume level.

10. The system of claim 7, wherein the value that represents the requested volume level is a percentage of a maximum volume of the audio system.

11. The system of claim 7, wherein the value that represents the requested volume level is a percentage change in the volume from the current volume level.

12. The system of claim 7, wherein the hardware processor is further programmed to establish the wireless local area network connection with the second screen device through which the requested volume level is received from the second screen device.

13. A non-transitory computer-readable medium containing computer executable instructions that, when executed by a processor of a first device, cause the processor to perform a method for controlling audio of an HDMI audio system, the method comprising:

causing audio data to be presented by an HDMI audio system at a current system volume level of the HDMI audio system;

receiving a requested volume level from a second screen device over a wireless local area network, wherein the requested volume level comprises a value that represents the requested volume level;

in response to receiving the requested volume level, controlling a system volume level of the HDMI audio system by:

(a) determining the current system volume level of the HDMI audio system;

(b) determining a requested change in volume based on a difference between the requested volume level and the current system volume level;

(c) determining a direction in which to cause the system volume level to change based on the requested change in volume;

(d) sending a volume control message to the HDMI audio system using a consumer electronic control bus connected to the HDMI audio system, wherein the volume control message indicates whether to increase or decrease the system volume level based on the determined direction in which to cause the system volume to change; and subsequent to (d), determining an updated current system volume level of the HDMI audio system;

(f) determining an updated requested change in volume based on a difference between the requested volume level and the updated current system volume level;

(g) determining an updated direction in which to cause the system volume level to change based on the updated requested change in volume; and (h) in response to determining the updated direction, sending an updated volume control message to the HDMI audio system using the consumer electronic control bus, wherein the updated volume control message indicates whether to increase or decrease the system volume level based on the determined updated direction in which to cause the system volume to change.

14. The non-transitory computer-readable medium of claim 13, wherein the method further comprises determining that the updated requested change in volume is greater than a volume control threshold that is a predetermined amount greater than or less than an initially determined current system volume.

15. The non-transitory computer-readable medium of claim 14, wherein the volume control threshold is a value at which the updated current system volume is determined to have crossed from one side of the requested volume level to the other side of the requested volume level.

16. The non-transitory computer-readable medium of claim 13, wherein the value that represents the requested volume level is a percentage of a maximum volume of the audio system.

17. The non-transitory computer-readable medium of claim 13, wherein the value that represents the requested volume level is a percentage change in the volume from the current volume level.

18. The non-transitory computer-readable medium of claim 13, wherein the method further comprises establishing the wireless local area network connection with the second screen device through which the requested volume level is received from the second screen device.

* * * * *